United States Patent
Wimplinger et al.

(10) Patent No.: US 9,305,813 B2
(45) Date of Patent: Apr. 5, 2016

(54) PRESSURE TRANSMITTING DEVICE FOR BONDING CHIPS ONTO A SUBSTRATE

(75) Inventors: Markus Wimplinger, St. Reid im Innkreis (AT); Alfred Sigl, Ottmaring (DE)

(73) Assignee: EV GROUP E. THALLNER GMBH, St. Florian am Inn (AU)

( * ) Notice: Subject to any disclaimer, the term of this patent is extended or adjusted under 35 U.S.C. 154(b) by 0 days.

(21) Appl. No.: 14/374,244

(22) PCT Filed: Mar. 16, 2012

(86) PCT No.: PCT/EP2012/054650
§ 371 (c)(1),
(2), (4) Date: Jul. 24, 2014

(87) PCT Pub. No.: WO2013/135302
PCT Pub. Date: Sep. 19, 2013

(65) Prior Publication Data
US 2015/0303082 A1 Oct. 22, 2015

(51) Int. Cl.
*H01L 21/67* (2006.01)
*H01L 21/687* (2006.01)
*H01L 23/00* (2006.01)

(52) U.S. Cl.
CPC .... *H01L 21/67144* (2013.01); *H01L 21/68771* (2013.01); *H01L 21/68778* (2013.01); *H01L 24/75* (2013.01); *H01L 24/89* (2013.01); *H01L 24/97* (2013.01); *H01L 2224/757* (2013.01); *H01L 2224/7532* (2013.01); *H01L 2224/75251* (2013.01); *H01L 2224/75252* (2013.01); *H01L 2224/75316* (2013.01); *H01L 2224/75317* (2013.01); *H01L 2224/75318* (2013.01); *H01L 2224/75724* (2013.01); *H01L 2224/75744* (2013.01); *H01L 2224/75822* (2013.01); *H01L 2224/75823* (2013.01); *H01L 2224/75824* (2013.01); *H01L 2224/9205* (2013.01); *H01L 2224/94* (2013.01); *H01L 2224/97* (2013.01); *H01L 2924/351* (2013.01)

(58) Field of Classification Search
None
See application file for complete search history.

(56) References Cited

U.S. PATENT DOCUMENTS

| | | | |
|---|---|---|---|
| 2001/0019174 A1 | 9/2001 | Cokely et al. | 257/738 |
| 2006/0292823 A1 | 12/2006 | Ramanathan et al. | 438/455 |
| 2008/0070376 A1 | 3/2008 | Vaganov et al. | 438/455 |
| 2009/0049687 A1 | 2/2009 | Shiraishi et al. | 29/839 |
| 2009/0314437 A1* | 12/2009 | Matsumura | B30B 5/02 156/580 |
| 2010/0327043 A1* | 12/2010 | Nakamura et al. | H01L 21/563 228/44.3 |

FOREIGN PATENT DOCUMENTS

| | | | |
|---|---|---|---|
| JP | 2011-253940 | 12/2011 | H01L 21/301 |
| JP | 2004047692 A | 2/2012 | H01L 21/60 |
| WO | WO 2011/152492 A1 | 12/2011 | H01L 21/301 |

* cited by examiner

*Primary Examiner* — Khaja Ahmad
(74) *Attorney, Agent, or Firm* — Kusner & Jaffe

(57) ABSTRACT

This invention relates to a pressure transmission apparatus for bonding a plurality of chips to a substrate. The pressure transmission apparatus includes a pressure body for applying a bonding force which acts in the bonding direction (B) to the chip. The pressure body has a first pressure side and an opposite second pressure side, both oriented to be transverse to the bonding direction (B). Fixing means are provided to attach to the periphery of the pressure transmission apparatus for fixing of the pressure transmission apparatus on a retaining body in the bonding direction (B). A sliding layer is provided for sliding motion of the pressure body transversely to the bonding direction (B).

10 Claims, 3 Drawing Sheets

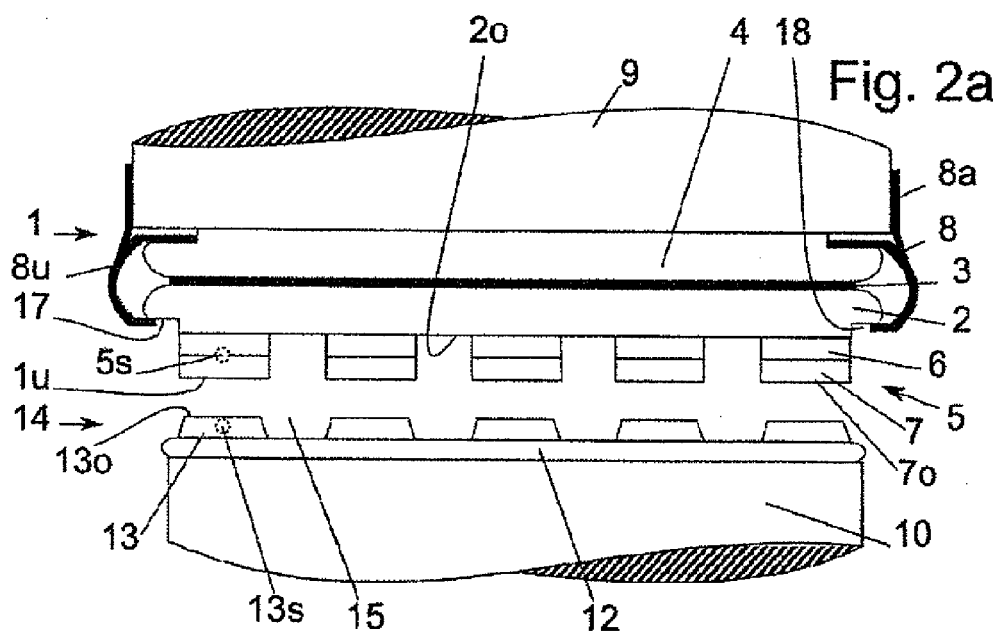
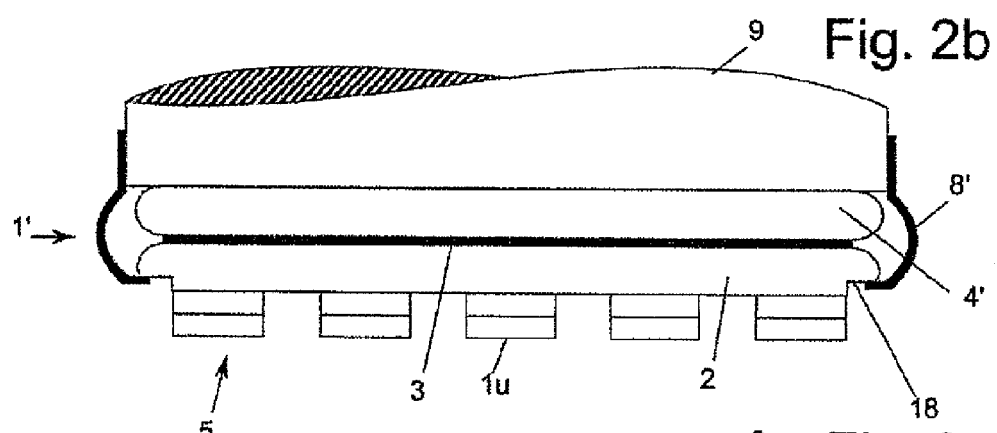
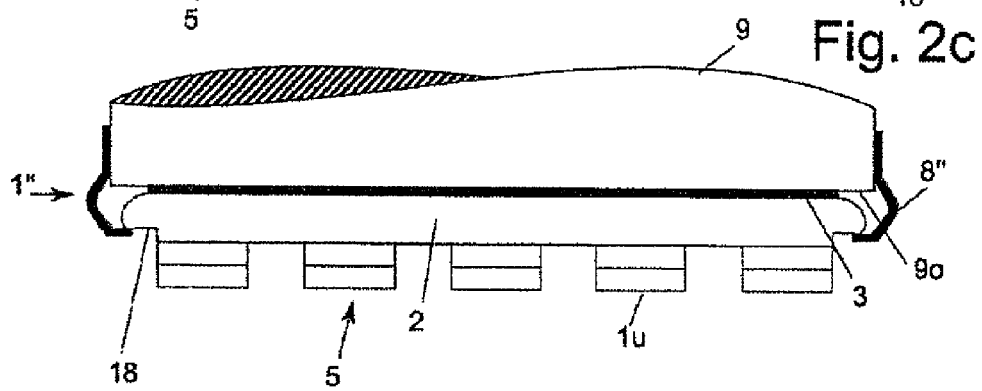

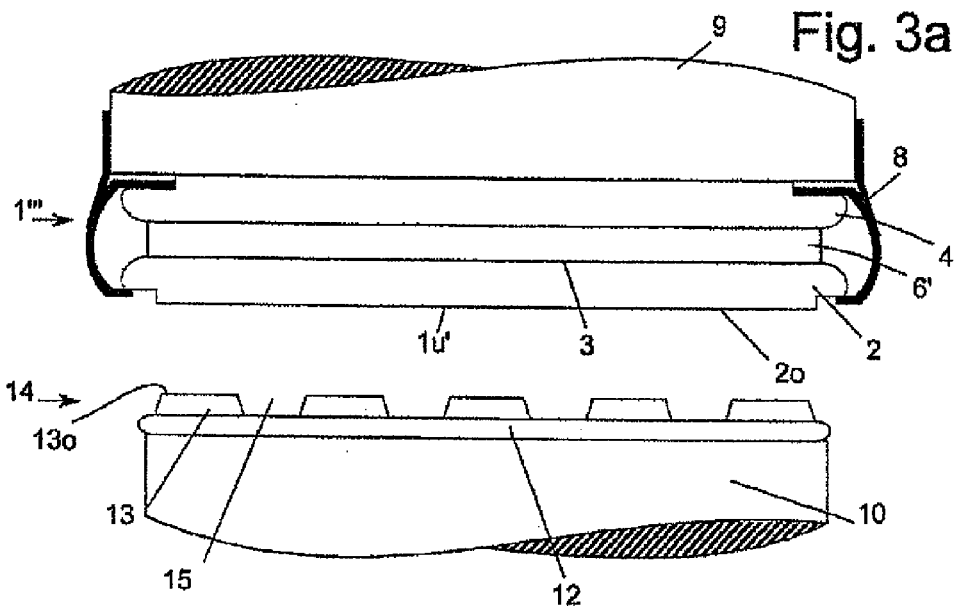
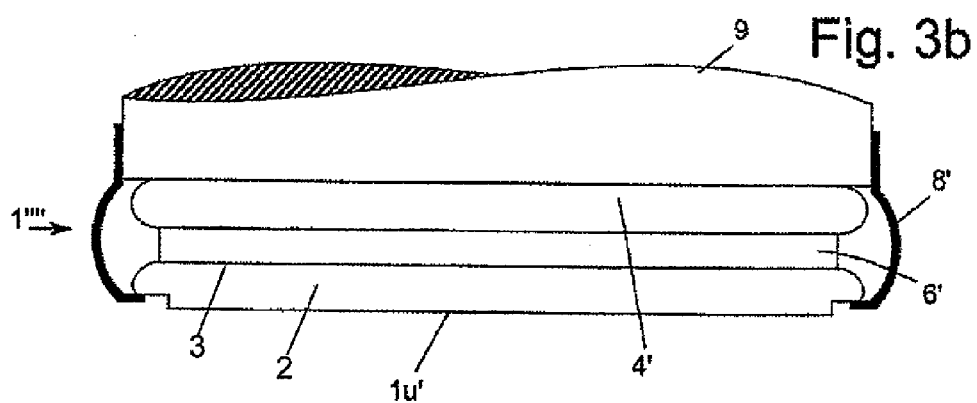
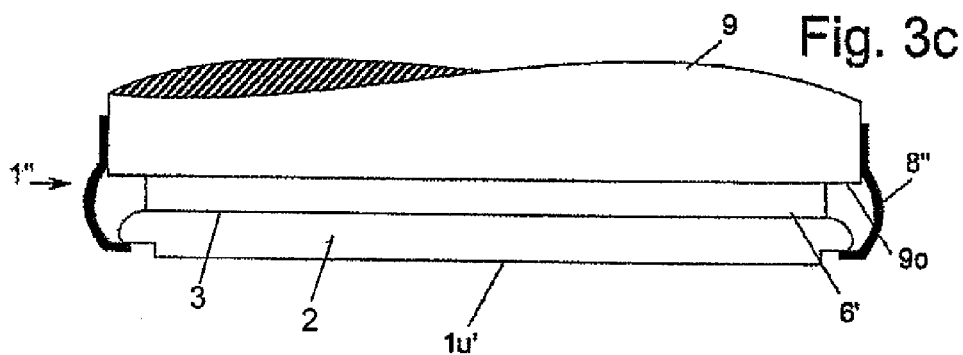

PRESSURE TRANSMITTING DEVICE FOR BONDING CHIPS ONTO A SUBSTRATE

FIELD OF THE INVENTION

This invention relates to a pressure transmission apparatus for bonding a plurality of chips to a substrate and a bonding device for bonding a plurality of chips to a substrate.

BACKGROUND OF THE INVENTION

In the semiconductor industry, there are several possible methods for connecting, i.e., bonding, different functional units to one another. One of these methods is the chip-to-wafer (C2W) method in which individual chips are bonded individually to a substrate. Another important method is the so-called "advanced chip-to-wafer" (AC2W) method in which the chips are first tentatively (temporarily) joined to the substrate and a permanent connection takes place in one bonding step, all chips being permanently bonded to the substrate at the same time. In the bonding step, the chips and the substrate are heated while the chips are being pressed onto the substrate (bonding force).

The aforementioned pressure and heating processes create technical problems, especially for structures which are becoming smaller and smaller, for example, due to thermal expansion during heating.

Therefore the object of this invention is to devise a pressure transmission apparatus and a bonding device with which the aforementioned method can be optimized and scrap is minimized during bonding.

This object is achieved with the features of the claims. Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination.

SUMMARY OF THE INVENTION

The basic idea of this invention is to configure a pressure transmission apparatus for bonding of a plurality of chips to a substrate, wherein the pressure transmission apparatus allows a sliding motion of a pressure body transversely to the bonding direction B. It is advantageous if there are limiting means for limiting the sliding motion transversely to the bonding direction B, the limiting means being in the form of fixing means for fixing of the pressure transmission apparatus on a retaining body in the bonding direction B. The use of this invention is especially advantageous with an AC2W method in which the chips are temporarily joined to a substrate and then bonded thereto using the pressure transmission apparatus in a bonding process. According to the invention, it is advantageous if prior to the pressure transmission, the process of heating to the bonding temperature is at least largely completed. In this way, the pressure body can slide transversely to the bonding direction B more freely than with an adjacent bonding force in the bonding direction B.

The substrate is preferably a semiconductor, more preferably a wafer.

The invention largely solves the technical problem of thermal stresses which occur during bonding between the pressure transmission apparatus and the chip surfaces since only the stresses of the pressure body itself are relevant since it (i.e., the pressure body) is at least largely decoupled from all components on the other side of the sliding layer transversely to the bonding direction B by the sliding layer as claimed in the invention. The sliding layer thus allows almost completely frictionless relative motion of the components bordering it. As claimed in the invention, the sliding layer is made as a preferably largely carbon-containing solid. Graphite, whose basal planes is aligned at least largely perpendicular to the bonding direction B, is chosen as the material.

According to one advantageous embodiment of the invention, it is provided that the fixing means are made elastic transversely to the bonding direction B. Thus, at the same time the fixing means can provide for holding the pressure transmission apparatus together in the bonding direction B while the sliding motion of the pressure body transversely to the bonding direction B is allowed. In addition, the fixing means can act in this way as the above described limiting means and thus can assume several functions as claimed in the invention.

Here it is especially advantageous if the fixing means are made as clamps for clamping a pressure body in the direction of the retaining body, especially with the sliding layer located in between. This configuration can be implemented especially easily in a space-saving manner and performs the aforementioned multiple functions.

In one embodiment of the invention, it is provided that the pressure body, with respect to material and/or dimensions, is chosen such that its thermal expansion properties at least in the transverse direction to the bonding direction B correspond to the thermal expansion properties of the product substrate. The material is preferably the material of the substrate and/or of the chip. It is especially advantageous as claimed in the invention if the dimensions of the pressure body essentially agree with the dimensions of the substrate, especially transversely to the bonding direction B. The thermal expansion properties comprise the coefficient of thermal expansion of the pressure body and/or of the substrate and/or of the chip. In particular, but not exclusively, material classes such as metal, ceramics, plastics or composite materials can be used, in particular Si, CTE matched glass, therefore glass whose coefficient of thermal expansion has been aligned to that of the product substrate, low CTE metals, etc. CTE matched glass and low CTE metals are also known. Mainly materials whose thermal conductivity is very high are preferred. The coefficient of thermal expansion of silicon is for example $2.6 \times 10^{-6}$ $K^{-1}$. The absolute amount of the difference of the coefficients of thermal expansion of the product substrate and the embodiment as claimed in the invention is less than $100 \times 10^{-6}$ $K^{-1}$, preferably less than $10 \times 10^{-6}$ $K^{-1}$, more preferably less than $1 \times 10^{-6}$ $K^{-1}$, most preferably less than $0.1 \times 10^{-6}$ $K^{-1}$, most preferably of all less than $0.01 \times 10^{-6}$ $K^{-1}$, most ideally $0$ $K^{-1}$.

By there being a layer which is elastic at least in the bonding direction B, and which is at least partially interrupted on intermediate spaces of the chip for pressure compensation, the pressure transmission apparatus also compensates for expansions, stresses and height differences in the bonding direction B so that uniform pressure application is enabled. The elastic layer is thus used as a compensation layer. In particular the elastic layer has a modulus of elasticity between 1 MPa and 100 GPa, preferably between 1 MPa and 10 GPa, even more preferably between 1 MPa and 1 GPa. Preferred materials are polymers. Rubber with an effective isotropic modulus of elasticity of roughly 1 MPa is used as the comparison value of the modulus of elasticity. Fiber-reinforced polymers are preferred with an effective modulus of elasticity along the longitudinal axis of the fiber of roughly 100 GPa. They mark the upper limit of the elastic material.

In another advantageous embodiment of the invention, it is provided that between the pressure body and the chip there is a hard layer which is at least partially interrupted on intermediate spaces of the chip for direct pressure transmission to the chips. The hard layer has a greater modulus of elasticity (especially twice as great) than the elastic layer, the hard layer being used as a protective layer. In particular the hard layer is also used to form a planar surface, with an average surface roughness of less than 10 μm, preferably less than 1 μm, even more preferably less than 100 nm, most preferably less than 10 nm. The hard layer is preferably made as an ultra hard layer. Preferred materials are metals and ceramics, especially iron materials, nonferrous metals, hard metals, nitride layers, carbide layers, boride layers and oxide ceramics. The thickness of the hard layer in the bonding direction B is less than 10 mm, more preferably less than 5 mm, even more preferably less than 2 mm, most preferably less than 500 μm, most preferably of all less than 100 μm.

Advantageously according to another embodiment, it is provided that the pressure body has fixing sites which are located on the periphery of the first pressure side, in the form of a preferably ring-shaped offset. In this way space-saving fixing of the pressure body on the retaining body is possible, due to possible heat transfer from the retaining body to the chips which are to be bonded during bonding a configuration of the pressure transmission apparatus as thin as possible in the bonding direction B being advantageous.

The described features of the pressure transmission apparatus apply analogously to the bonding device as claimed in the invention.

Other advantages, features and details of the invention will become apparent from the following description of preferred exemplary embodiments and using the drawings.

BRIEF DESCRIPTION OF THE DRAWINGS

FIG. 2a shows a schematic detail view of the bonding device as claimed in the invention in a first embodiment;

FIG. 2b shows a schematic front view of another embodiment of the pressure transmission apparatus as claimed in the invention;

FIG. 2c shows a schematic side view of the pressure transmission apparatus as claimed in the invention in another embodiment;

FIG. 3a shows a schematic detail view of another embodiment of the bonding device as claimed in the invention;

FIG. 3b shows a schematic side view of the pressure transmission apparatus as claimed in the invention in another embodiment; and FIG. 3c shows a schematic side view of the pressure transmission apparatus as claimed in the invention in another embodiment.

DETAILED DESCRIPTION OF PREFERRED EMBODIMENTS

Figure 1:
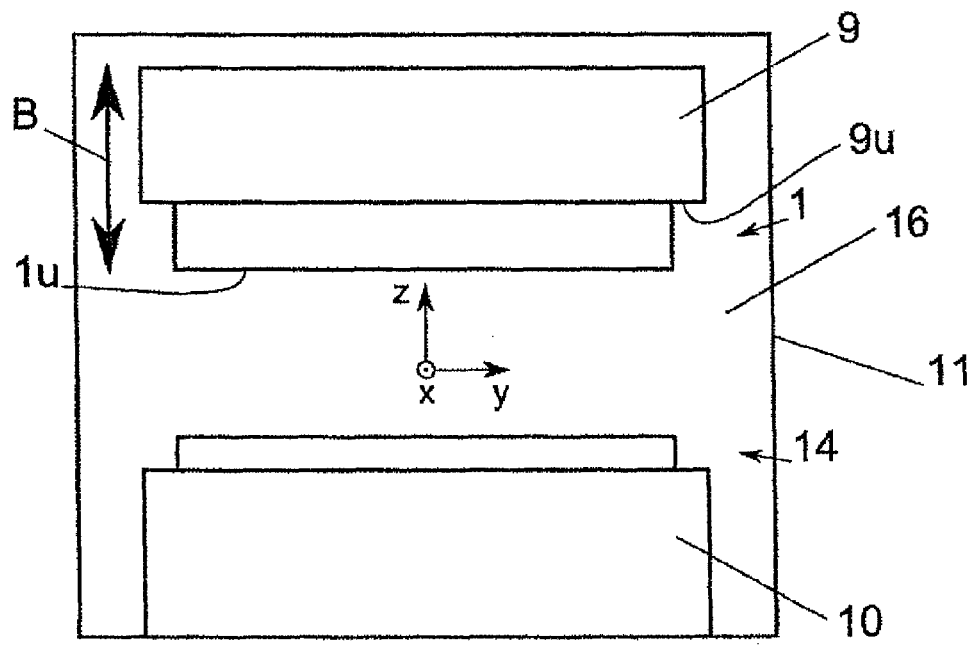
FIG. 1 shows a schematic side view of the bonding device as claimed in the invention.

The same or equivalent components are identified with the same reference numbers in the figures.

FIG. 1 shows a schematic and highly simplified representation of a bonding device with a housing 11 which surrounds a bonding chamber 16. Bonding chamber 16 can be loaded and unloaded via an opening which is not shown and which can be closed with a door which is not shown. In the bonding chamber 16 a defined atmosphere and temperature can be set, for which there can be corresponding feed lines and discharge lines or heating means. A retaining body 9 and/or a receiver 10 are used as heating means.

On the floor of the bonding chamber 16 receiver 10 is provided for accommodating a product substrate 14. Fixing of the product substrate 14 can take place by vacuum paths, mechanical clamping or by electrostatics.

The product substrate 14 is comprised of a substrate 12 which rests on the receiver 10 and is fixed on the latter, and chips 13 which are temporarily fixed on the substrate 12 and for whose permanent fixing the bonding device is intended.

Above the receiver 10 there is a retaining body 9. The retaining body 9 is able to move relative to the receiver 10, specifically in one X, one Y and one Z direction. The retaining body 9 can preferably also be turned around, i.e., adjusted, relative to the X, Y and/or Z axis in order to compensate for wedge faults or to improve the orientation of the surfaces to one another. The relative motion takes place preferably by movement of the retaining body 9, while the receiver 10 is rigid or does not have any degrees of freedom.

After loading of the product substrate 14 into the bonding chamber 16, a pressure transmission apparatus 1 is attached to one lower side 9u of the retaining body 9. The pressure transmission apparatus 1 is aligned relative to the product substrate 14 and lowered until the pressure transmission apparatus 1 adjoins its side 1u which is opposite the product substrate 14. A defined bonding force is applied to the chip surface 13o of the chip 13 by a corresponding control of the movement in the bonding direction B. At the same time or subsequently, the product substrate 14 is heated to a bonding temperature. The process is controlled by a control apparatus.

FIG. 2a details the pressure transmission apparatus 1 and the product substrate 14. The relations of the illustrated parts are made highly schematic for purposes of representation. In this respect, the chips 13 do not correspond to true circumstances.

In the first illustrated embodiment according to FIG. 2a, the pressure transmission apparatus 1 in addition to a pressure body 2 which all embodiments have, additionally has a retaining body 4 which is clamped to the pressure body 2 via a fixing means 8 in the form of several clamps which have been clipped on the periphery of the pressure body 2 and of the retaining body 4.

Between the pressure body 2 and the retaining body 4, a sliding layer 3 is provided over the entire surface, by which the sliding motion of the pressure body 2 transversely to the bonding direction B is enabled.

The pressure body 2 and the retaining body 4 are made especially mirror-imaged (reflected on the sliding layer 3).

The pressure transmission apparatus 1 is fixed on the retaining body 9 of the bonding device by the fixing means 8, especially arms 8a molded on the clamps. Alternatively or in addition the retaining body 4 can be fixed on the retaining body 9 by vacuum paths.

The fixing means 8 have a U-shaped section 8u between whose arms the clamping of the pressure body 2 to the retaining body 4 takes place. The U-shaped section 8u thus surrounds one part of the periphery of the pressure body 2 and of the retaining body 4. For engaging the U-shaped section 8u there are fixing sites 17 on the pressure body 2 on a first pressure side 2o. In the embodiment shown, fixing sites 17 are in the form of a ring-shaped offset on the periphery of the pressure body 2. Transversely to the bonding direction B at the fixing site there is play 18 (i.e., a space) so that a sliding motion of the pressure body 2 transversely to the bonding direction B is enabled.

The opposite arm of the U-shaped section 8u engages a corresponding fixing site of the retaining body 4, preferably there being fixing without play here.

On a first pressure side 2o of the pressure body 2 which is facing away from the sliding layer 3, pressure elements 5 are attached, specifically at the positions which correspond to the chips 13 on the substrate 12 along the X and Y direction, therefore along the first pressure side 2o. The pressure elements 5 are comprised of an elastic layer 6, which is interrupted corresponding to the intermediate spaces 15 defined between the chips 13, and of a hard layer 7, which has been applied to the elastic layer 6. The hard layer 7 is likewise interrupted analogously to the elastic layer 6 in the region of the intermediate spaces 15 so that any side forces which run transversely to the bonding direction are minimized when pressure is applied to the chips 13.

When pressure is applied to the chips 13 with the pressure surface 1u, here on one surface 7o of the hard layer 7, the centers of gravity 5s of the pressure elements 5 are aligned with and centered to the centers of gravity 13s of the individual chips 13. The pressure elements 5 exactly follow the chips 13 due to the similar or identical coefficients of thermal expansion of the pressure body 2 and of the substrate 12, and due to the largely frictionless relative motion of the pressure body 2 transversely to the bonding direction B so that no transverse displacements and transverse forces are caused.

In FIG. 2b there is a simplified fixing means 8' in which the pressure body 2 and the retaining body 4 are fixed by a modified fixing means 8' which attaches exclusively at fixing sites of the pressure body 2, but not on the retaining body 4. In this embodiment, the fixing takes place in the bonding direction B between the pressure body 2 and the retaining body 9. The kinematics of the pressure body 2 and of the sliding layer 3 with the play 18 is that in FIG. 2a. Thus an altered, simpler pressure transmission apparatus 1' in a simpler design is formed since the fixing means 8' and the retaining body 4' are made simpler.

In the embodiment according to FIG. 2c, the retaining body 4 is omitted and the sliding layer 3 is provided directly between the pressure body 2 and the retaining body 9. An altered pressure transmission apparatus 1" is formed which is made simpler than the above described pressure transmission apparatus 1, 1' since a retaining body 4, 4' can be omitted and the pressure transmission apparatus 1" can be made thinner and better transfers the heat, to the extent heat is produced by the retaining body 9.

Conversely, in the embodiment shown in FIG. 3a, the pressure elements 5 shown in FIGS. 2a to 2c are omitted so that the first pressure side 2o of the pressure body 2 assumes the function of the hard layer 7. There is an elastic layer 6' between the pressure body 2 and the retaining body 4. On the interface between the elastic layer 6' and the pressure body 2 there is the sliding layer 3 while the fixing means 8 corresponds to the fixing means 8 from FIG. 2a. Thus an altered embodiment of the pressure transmission apparatus 1''' is provided.

The first pressure side 2o in this embodiment acts as a pressure surface 1u' with which pressure is applied to the surface 13o of the chip 13.

In the embodiment shown in FIG. 3b, according to the embodiment shown in 2b there are fixing means 8' which omit engagement with the retaining body 4'. Thus an altered embodiment of the pressure transmission apparatus 1'''' is provided.

In the execution of the pressure transmission apparatus 1'''' shown in FIG. 3c the retaining body 4, 4' is omitted according to the execution described in FIG. 2c. Accordingly fixing means analogously to the fixing means 8" are used.

REFERENCE NUMBER LIST 1, 1', 1", 1''', 1'''' pressure transmission apparatus
1u, 1u' pressure surfaces
2 pressure body
2o first pressure side
2f second pressure side
3 sliding layer
4, 4' retaining body
5 pressure element
6, 6' elastic layer
7 hard layer
8, 8' 8" fixing means
8a arms
8u u-shaped section
9 retaining body
9u lower side
10 receiver
11 housing
12 substrate
13 chips
13o chip surface
13s center of gravity
14 product substrate
15 intermediate spaces
16 bonding chamber
17 fixing sites
18 play
Bonding direction B

The invention claimed is:

1. A pressure transmission apparatus for bonding a plurality of chips to a substrate, said pressure transmission apparatus comprised of:
   a pressure body for applying a bonding force in a bonding direction (B) to the plurality of chips, the pressure body having a first pressure side and an opposite second pressure side, said first and second pressure sides oriented in a direction transverse to the bonding direction (B),
   fixing means attached to a periphery of the pressure body for fixing the pressure body to a retaining body, said fixing means
   a) being made elastic in said direction transverse to the bonding direction (B) and/or
   b) being made as clamps for clamping the pressure body to the retaining body, and
   a sliding layer disposed between the pressure body and the retaining body for allowing the pressure body to slide in said direction transverse to the bonding direction (B).

2. The pressure transmission apparatus as claimed in claim 1, further comprising a layer which is elastic at least in the bonding direction (B) and which is at least interrupted on intermediate spaces of the plurality of chips for pressure compensation.

3. The pressure transmission apparatus as claimed in claim 1, in which between the pressure body and the plurality of chips, there is a hard layer which is interrupted on intermediate spaces of the plurality of chips for direct pressure transmission to the plurality of chips.

4. The pressure transmission apparatus as claimed in claims 1, 2 or 3, in which the pressure body has fixing sites which are located on a periphery of the first pressure side, especially in the form of a preferably ring-shaped offset.

5. A bonding device for bonding a plurality of chips to a substrate, comprising:

a pressure transmission apparatus, as claimed in claims 1, 2 or 3,
a receiver for accommodating the substrate,
a heating means for heating the plurality of chips and the substrate, and
a drive means for applying the bonding force by movement of the retaining body in the bonding direction (B).

6. A method for bonding a plurality of chips on a substrate with a pressure transmission apparatus according to claim 1.

7. The method according to claim 6, wherein the pressure body, especially with respect to material and/or dimensions, is chosen such that its thermal expansion properties at least in the transverse direction to the bonding direction (B) correspond to the thermal expansion properties of the substrate.

8. In a device for bonding a plurality of chips to a substrate, said device having a retaining body movable in a bonding direction (B) and a pressure transmission apparatus according to claim 1.

9. A method for bonding a plurality of chips on a substrate with a bonding device according to claim 5.

10. The method according to claim 9, wherein the pressure body, especially with respect to material and/or dimensions, is chosen such that its thermal expansion properties at least in the transverse direction to the bonding direction (B) correspond to the thermal expansion properties of the substrate.

* * * * *